United States Patent [19]
Bliss et al.

[11] Patent Number: 6,143,070
[45] Date of Patent: Nov. 7, 2000

[54] SILICON-GERMANIUM BULK ALLOY GROWTH BY LIQUID ENCAPSULATED ZONE MELTING

[75] Inventors: David F. Bliss, Arlington, Mass.; Brian G. Demczyk, West Newton, Pa.; John Bailey, Temple, N.H.

[73] Assignee: The United States of America as represented by the Secretary of the Air Force, Washington, D.C.

[21] Appl. No.: 09/093,846

[22] Filed: May 15, 1998

[51] Int. Cl.$^7$ .................................................. C30B 13/10
[52] U.S. Cl. ............................................. 117/49; 117/939
[58] Field of Search .................................. 117/2, 49, 939

[56] References Cited

U.S. PATENT DOCUMENTS

| | | | |
|---|---|---|---|
| 4,824,520 | 4/1989 | Morrison | 156/620 |
| 4,857,278 | 8/1989 | Gevelber et al. | 422/249 |
| 4,946,542 | 8/1990 | Clemans | 156/607 |
| 5,007,980 | 4/1991 | Swiggard | 156/620 |
| 5,057,287 | 10/1991 | Swiggard | 422/248 |

OTHER PUBLICATIONS

P.S. Ravishankar, "Liquid Encapsulated Bridgman (LEB) Method for Directional Solidification of Silicon Using Calcium Chloride," Journal of Crystal Growth 94(1989) 62–68.
I. Yonenaga, A. Matsui, S. Tozawa, K. Sumino, T. Fukuda, "Czochralski Growth of Ge1–x Six Alloy Crystals," Journal of Crystal Growth 154 (1995) 275–279.
J. Wollweber, D. Schulz, W. Schroder, "Si$_x$Ge$_{1-x}$ Single Crystals Grown by the RF–heated Float Zone Technique," Journal of Crystal Growth 163 (1996) 243–248.

*Primary Examiner*—Benjamin Utech
*Assistant Examiner*—Kin-Chan Chen
*Attorney, Agent, or Firm*—Stanton E. Collier

[57] ABSTRACT

The present invention describes the growth of single crystals of non-congruently melting alloys, in particular, silicon-germanium of constant composition in a quartz ampoule by the use of CaCl$_2$ as an encapsulant for the liquid encapsulated zone melting (LEZM) technique. The zone melting process was modified with the addition of calcium chloride which acts as a liquid encapsulant at temperatures above 660° C. so that the crystal can grow without sticking to the container. The calcium chloride encapsulant creates a non-wetting buffer layer between the quartz container and the SiGe charge material allowing single crystal growth of mixed alloys. The crystal growth system consists of a vertical tube RF furnace with a water cooled split-ring concentrator. The concentrator is 5 mm. Thick by 25 mm diameter and provides a high temperature melt zone with a "spike" profile. The single crystal seed and the polycrystalline alloy charge are loaded into a quartz ampoule which fits freely through the concentrator coil. The encapsulant calcium chloride is placed on top of the charge so that when it melts, it covers the inner surface of the quartz ampoule. During operation the alloy charge is melted in the "spike" zone at the seed interface, and then the molten zone is translated along the length so that a single crystal of uniform composition is formed.

5 Claims, 5 Drawing Sheets

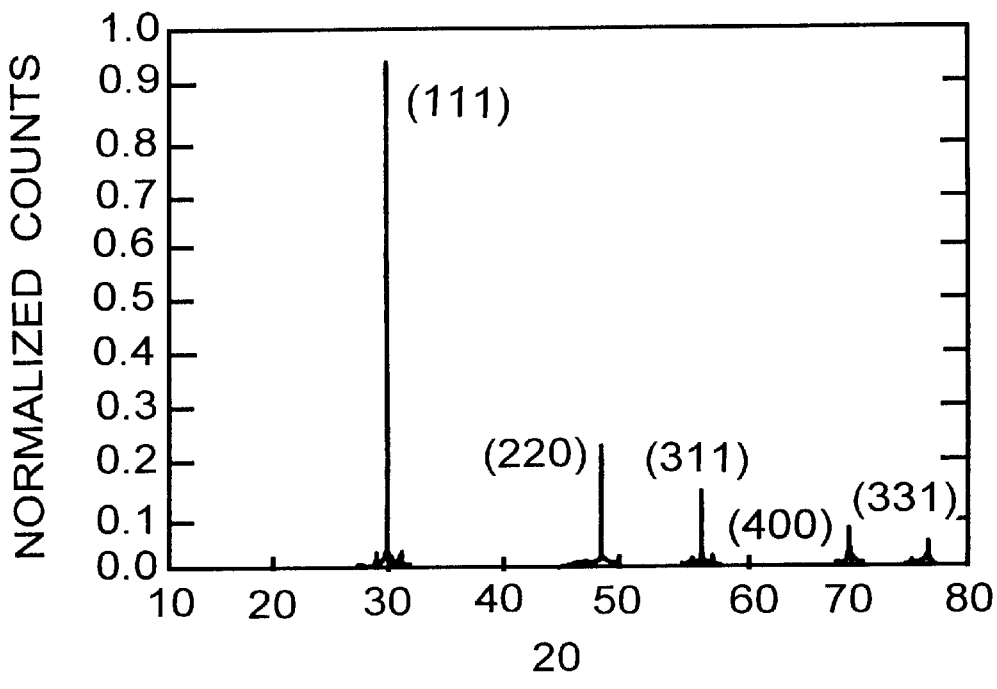
FIG. 3A POLYCRYSTAL SILICON SEED
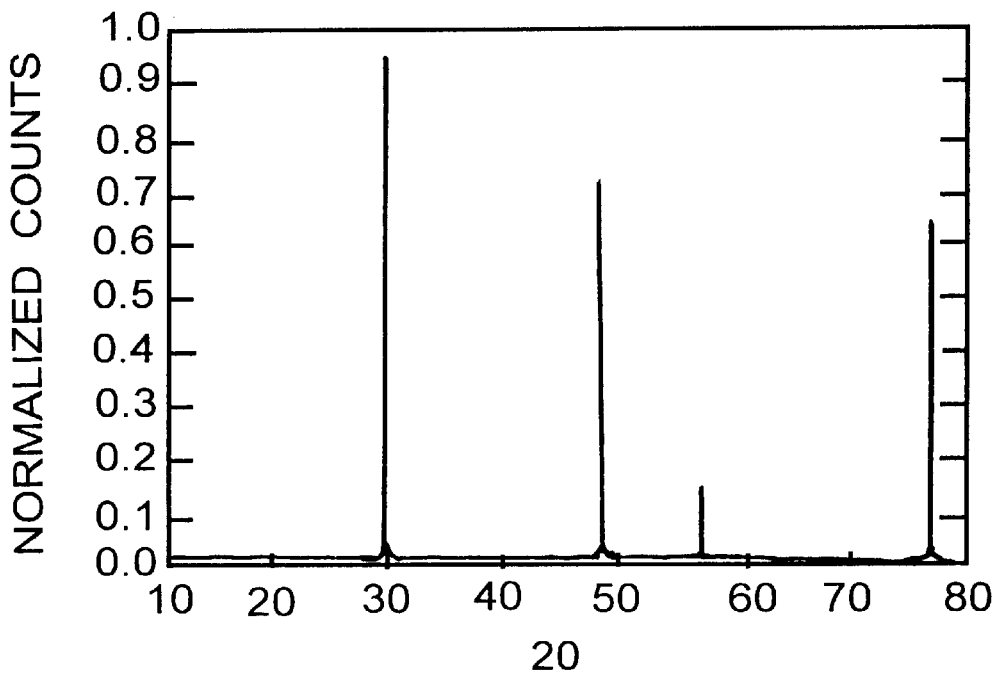
FIG. 3B POLYCRYSTAL GROWN SiGe ALLOY

SINGLE CRYSTAL SEED

GROWN SiGe ALLOY

SILICON-GERMANIUM BULK ALLOY GROWTH BY LIQUID ENCAPSULATED ZONE MELTING

STATEMENT OF GOVERNMENT INTEREST

The invention described herein may be manufactured and used by or for the Government for governmental purposes without the payment of any royalty thereon.

BACKGROUND OF THE INVENTION

The present invention relates to crystal growth, and, in particular, relates to the growth of bulk crystals of silicon-germanium.

Single crystals of $Si_{1-x}Ge_x$ are of interest for a variety of applications from high speed microelectronics to thermophotovoltaics. Many of these applications require deposition of thin films onto silicon substrates with a consequent strain due to lattice mismatch. Since bulk crystals of uniform concentration are not yet available, the growth of unstrained layers directly on the substrate is out of the question, and a comparison of the properties of strained layers with the intrinsic bulk properties is impossible. In fact, there has been little investigation of the physical properties of bulk SiGe alloys and their potential application for electronic and photonic devices. Despite the fact that silicon and germanium form a continuous solid solution, growth from the melt has had limited success in the past because solidification is non-congruent with the melt. Attempts at Czochralski growth and Bridgman growth techniques have shown that such conservative growth processes cannot produce crystals of constant composition. More recent studies have pointed to the floating zone technique in order to control the composition. While this method offers the possibility of containerless growth, it requires metered feeding of germanium granules into a silicon rod in order to control the growth composition. In the case of contained growth, an additional problem arises from the nucleation of multiple grains because of the melt sticking to the container. A solution to this problem was discussed in earlier work on directional solidification of silicon using calcium chloride. Both of these are obstacles to successful crystal growth, compositional uniformity and adherence of the melt.

Thus, there exists a need for a process for growing single crystals of silicon-germanium of uniform compositional quality.

SUMMARY OF THE INVENTION

The present invention describes the growth of single crystals of non-congruently melting alloys, in particular, silicon-germanium of constant composition in a quartz ampoule by the use of $CaCl_2$ as an encapsulant for the liquid encapsulated zone melting (LEZM) technique.

The zone melting process was modified with the addition of calcium chloride which acts as a liquid encapsulant at temperatures above 660° C. so that the crystal can grow without sticking to the container. The calcium chloride encapsulant creates a non-wetting buffer layer between the quartz container and the SiGe charge material allowing single crystal growth of mixed alloys.

The crystal growth system consists of a vertical tube RF furnace with a water cooled split-ring concentrator. The concentrator is 5 mm. Thick by 25 mm diameter and provides a high temperature melt zone with a "spike" profile. The single crystal seed and the polycrystalline alloy charge are loaded into a quartz ampoule which fits freely through the concentrator coil. The encapsulant calcium chloride is placed on top of the charge so that when it melts, it covers the inner surface of the quartz ampoule. During operation the alloy charge is melted in the "spike" zone at the seed interface, and then the molten zone is translated along the length so that a single crystal of uniform composition is formed.

Therefore, one object of the present invention is to provide a process for making single crystals of silicon-germanium of uniform composition.

Another object of the present invention is to provide a process of making bulk size single crystals of silicon-germanium.

Another object of the present invention is to provide a process for controlling sticking and nucleation of the growing crystal.

Another object of the present invention is to provide a process for controlling the compositional uniformity both longitudinally and axially along the crystal.

These and many other objects and advantages of the present invention will be readily apparent to one skilled in the pertinent art from the following detailed description of a preferred embodiment of the invention and the related drawings.

BRIEF DESCRIPTION OF THE DRAWINGS

FIGS. 3a, 3b, 3c, and 3d illustrate x-ray diffraction ($\Theta$–$2\Theta$) scans. FIG. 3a is from a polycrystalline silicon seed; FIG. 3b is from an alloy grown on the seed of FIG. 3a; FIG. 3c is a scan from a single crystal [111] silicon seed; and FIG. 3d is a scan from a single crystal alloy (4.5 at. %) grown on the seed of FIG. 3c.

DESCRIPTION OF THE PREFERRED EMBODIMENT

Alloy crystals of silicon germanium have been grown by the liquid encapsulated zone melting (LEZM) method. This method combines zone melting in a quartz container with liquid encapsulation by the molten salt $CaCl_2$ to prevent nucleation at the container-melt interface. Electron beam and x-ray analysis were used to characterize the crystal structure and composition of bulk crystals. Crystals of constant alloy composition at 4.5 at. % have been grown by this technique and reveal single crystal structure and a high degree of compositional uniformity.

Figure 1:
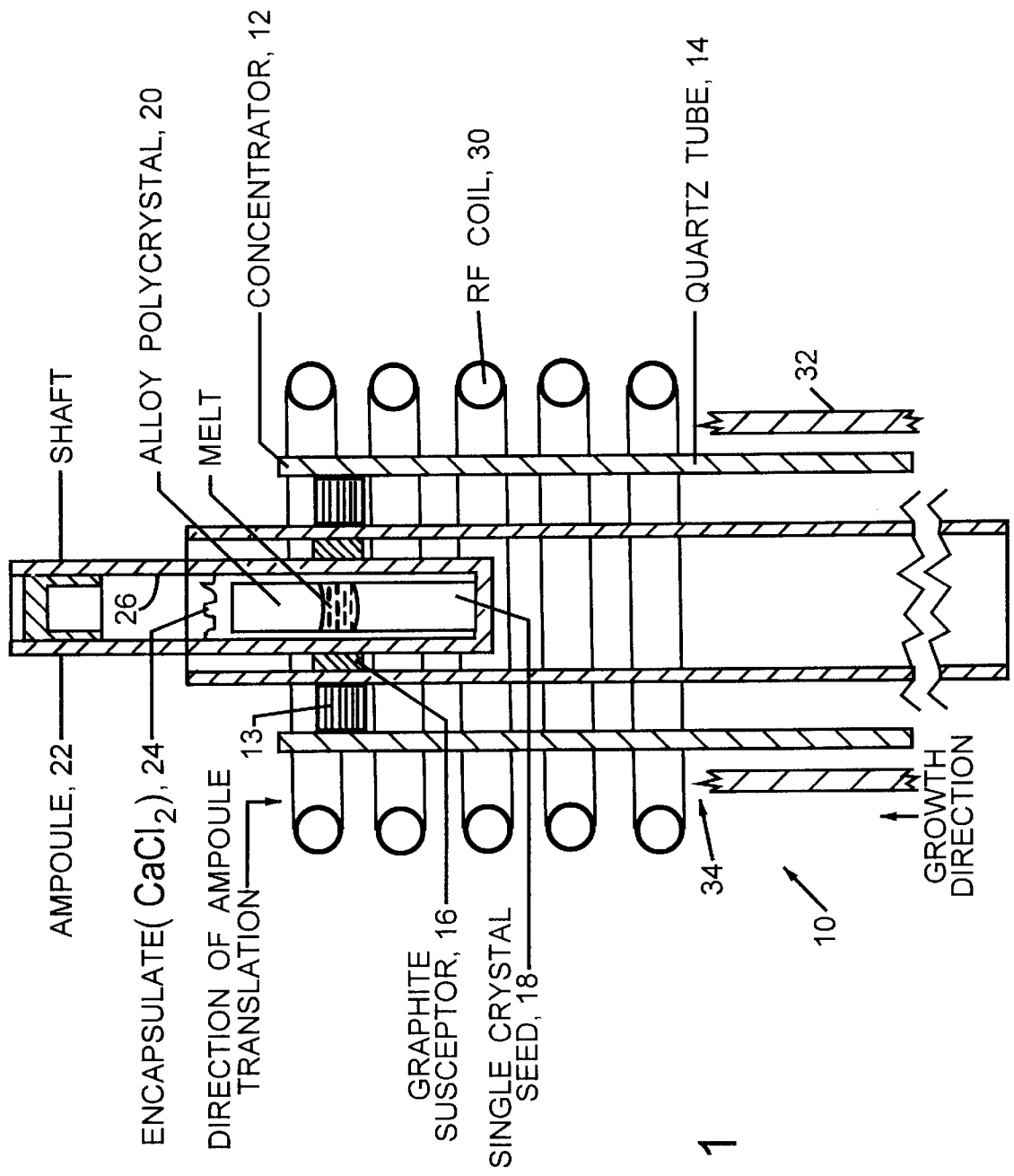
FIG. 1 illustrates the liquid encapsulated zone melting growth apparatus of the present invention.

A vertical tube RF furnace 10, only partially shown in FIG. 1, has an RF coil 30 positioned about a quartz tube 32 having a top and a bottom cover adapted thereto. Inside the furnace 10, a crystal growth apparatus 34 has been adapted with a water cooled concentrator coil 12 for zone refining. The split-ring concentrator part 13 is 5 mm thick by 25 mm diameter and fits inside the 85 mm diameter vertical tube 14 as shown in FIG. 1. Although in principle, the coupling between the concentrator 12 and a charge should be sufficient to melt the silicon-germanium polycrystalline charge, the power supply did not have enough power to reliably melt the charge directly. In view of this, a graphite susceptor ring 16 was placed inside the concentrator coil 12 to provide a direct source of radiant heat. A silicon seed 18 and an alloy charge 20 were loaded into a quartz ampoule 22 which fit freely through the graphite susceptor ring 16. As shown in FIG. 1, the silicon single crystal seed 18 was loaded into the bottom of the ampoule 22, followed by a disk of pure germanium, not shown, and then a cylinder of pre-cast silicon germanium alloy 20 on top thereof. The encapsulant $CaCl_2$ 24 was placed on top of the charge, so that when it melted, it covered the inner surface 26 of the quartz ampoule 22.

The temperature profile of the zone melting system was measured using a fiber optic thermometer system made by Luxtron Inc. The fiber, not shown, was inserted into a quartz tube in the middle of a pre-drilled SiGe charge 20, and temperature data was recorded as the fiber was removed through the hot zone at a rate of a few millimeters per hour. In this way the sapphire fiber, which was coated with a thin coating of refractory metal at the tip, was used to record the temperature from the seed through the molten zone and into the alloy charge.

Alloy melts were examined in a JEOL 840 scanning electron microscope (SEM) at 20 keV to guage microstructural and chemical composition homogeneity. The latter was determined via the use of backscattered electrons to form an image whose contrast is strongly dependent on atomic number. Electron channeling patterns were used on cleaved samples to ascertain the crystal orientation and degree of orientational variation. However, such channeling contrast is extremely sensitive to the degree of surface perfection, rendering the technique impractical for routine examination of sliced sections. More generally, sample orientations were deduced by $\Theta-2\Theta$ X-ray diffraction (XRD) scans, for which a Philips XRG 3100 unit was employed (20 kV accelerating voltage). Relative chemical compositions were obtained by energy dispersive X-ray spectroscopy (EDS), using a NORAN 5500 microanalysis system, coupled to the SEM. Such data are extremely useful in assessing run-to-run variations. When more precise values were required, wavelength sensitive spectroscopy (WSS) was utilized (Geller Microanalytical Laboratory).

The LEZM technique provides a useful solution to two problems associated with single crystal growth of non-congruently melting alloys wherein the melt composition is different than the crystal composition. First, the liquid encapsulant minimizes the reaction between the melt and the container, reducing the sticking problem and controlling nucleation. Second, the molten zone technique controls the compositional uniformity of the solid solution both radially and from seed to tail.

Crucible compatibility was investigated by measuring the wetting angle between SiGe alloys and a variety of crucible materials. Silica, graphite, SiC and BN were all found to create some degree of sticking with the SiGe melts. This led to the conclusion that there were no compatible containment vessels, thereby prompting the use of $CaCl_2$ encapsulant, first employed by Ravishankar for directional growth of silicon only.

Figure 2:
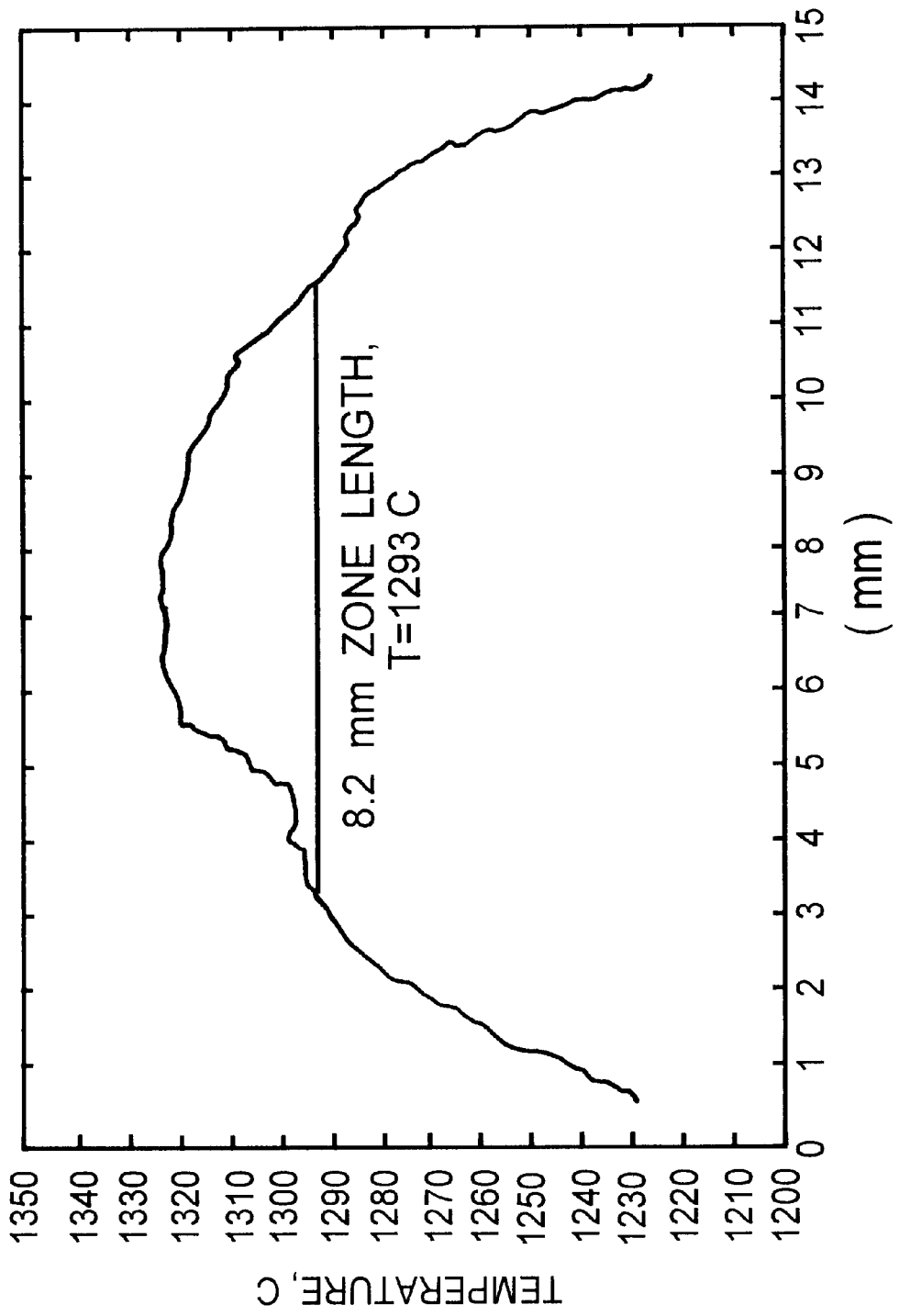
FIG. 2 illustrates the axial temperature profile through the center of a SiGe melt zone.

Control of the LEZM process requires knowledge of several key parameters. The size and composition of the molten zone are variables which are directly tied to the zone temperature. For example, if the temperature is increased, the length of the molten zone will increase and the composition will move toward the silicon side as more of the seed material is incorporated into the molten zone. Precise measurement of the thermal gradient is necessary to predict the alloy composition. The internal shape of the zone is also an important parameter as well as the position of the zone within the concentrator. To measure the thermal profile as accurately as possible, we used an optical fiber thermometer with a refractory metal coating on the tip to provide a constant emissivity source. A quartz tube was inserted into a hole drilled through the pre-cast charge so that the sapphire fiber could slide up and down through the hot zone. The temperature was held constant and the ampoule held fixed to obtain a stable molten zone, while the fiber was slowly withdrawn. The resulting temperature profile is shown in FIG. 2. The thermal gradient for solidification between the seed and the melt is measured to be 170° C./cm, while the melting gradient above the molten zone is 210° C./cm. The plateau formed by the 5 mm spike zone has a slight slope of 20° C./cm, indicating that more heat is lost from the top than the bottom of the system. In fact, the molten zone is significantly larger than the 5 mm plateau, since melting and solidification occur on the steep slope at the edges of the spike zone. The actual size of the molten zone must be determined by accurate measurement of the solidified zone. Afterwards the charge was sectioned so that the size and shape of the molten zone could be measured and the composition analyzed. The measured zone length was 8.2 mm. which, from FIG. 2, corresponds to a liquidus temperature of 1293° C., or 45% atomic germanium in the melt. The shape of the molten zone could also be detected from a sharp break in the microstructure as seen in the cross-section. The melt interface is convex in both directions, toward the seed and toward the charge.

Figure 3C:
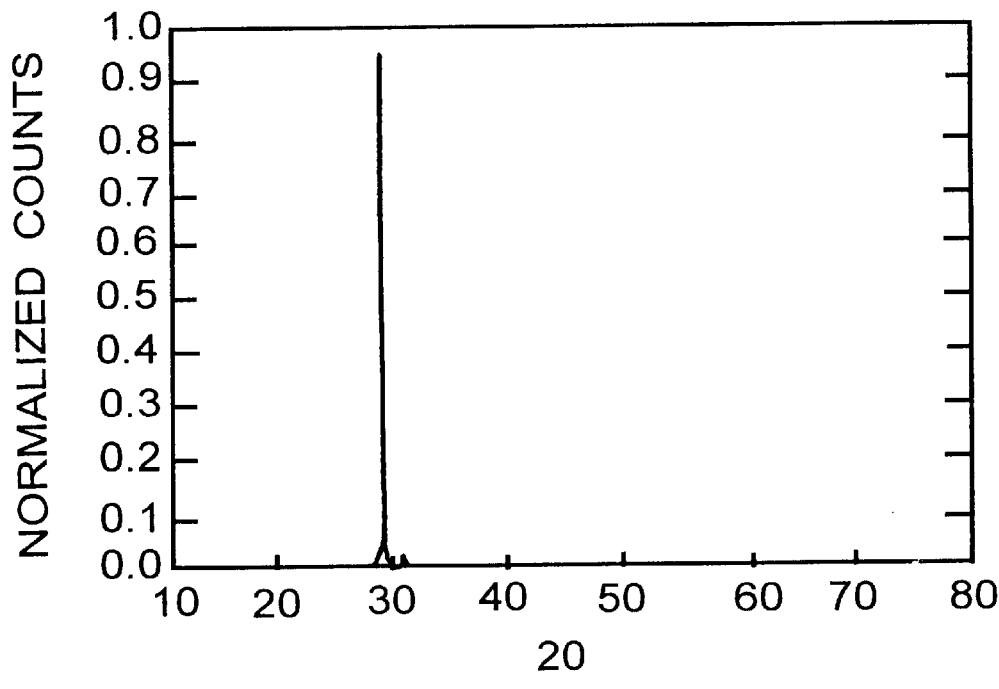
Figure 3D:
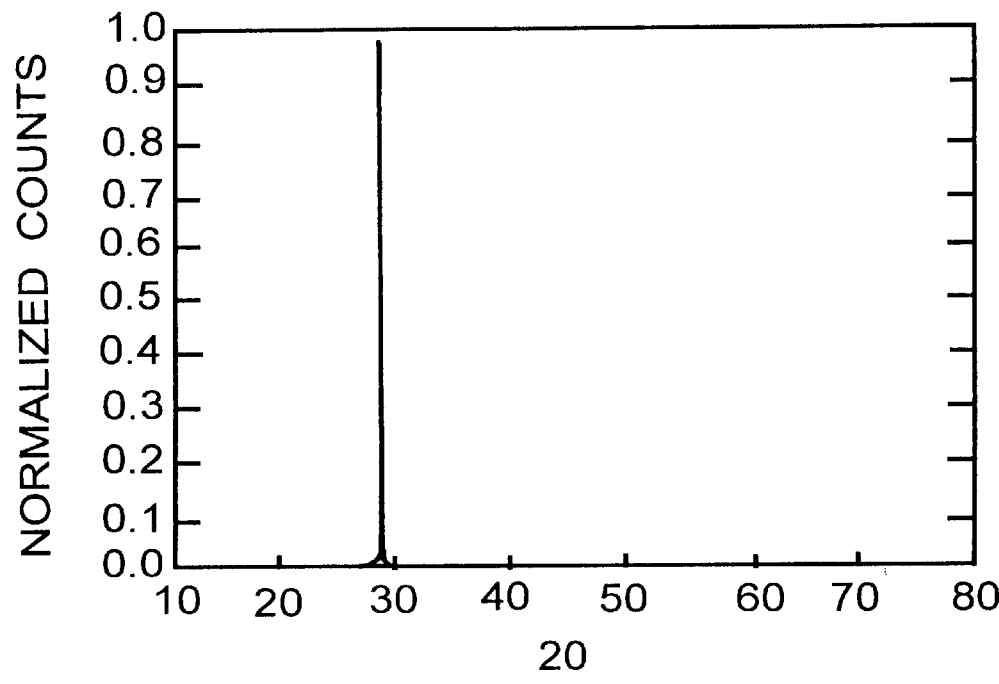

The first crystals grown without $CaCl_2$ encapsulant produced well oriented samples as illustrated in FIG. 3a, which shows a cleaved facet (average Ge concentration −7 at. %). FIG. 3b is the corresponding electron channeling pattern, formed from backscattered electrons. The six fold symmetry of the pattern attests to the predominance of the [111] zone axis within the −2 micron sampling volume. Although well oriented crystals were grown in this manner, they were found to adhere strongly to the quartz ampoule, which often resulted in their fracture upon cooling and subsequent removal from the ampoule. Later attempts using $CaCl_2$ as an encapsulant were successful in reducing the sticking problem. In order to test the compositional uniformity of crystals grown by the LEZM method, alloys were initially grown on polycrystalline Si seeds, resulting in crystals displaying multiple orientations. This is shown by the XRD patterns which compares the grown alloy (FIG. 4b) with the initial seed. The presence of strong (220) and (331) peaks (both at a considerable angular distance from the dominant (1|1)) in the alloy suggests inhomogeneous heat transport in the cooling melt. Efforts were then redirected towards growth on single crystal Si seeds. The results of a typical growth are shown in the XRD pattern which nearly reproduces that of the starting seed material. In preparation for alloy crystal growth, SiGe feedstock material is prepared by melting silicon and germanium raw material (along with the $CaCl_2$ encapsulant), followed by rapid quenching. Using the pre-cast alloy charge, plus an intermediate region of pure Ge to provide new material as the molten zone moves upward, and a single crystal Si seed, the resulting crystal was a well oriented alloy. There was good improvement in compositional homogeneity with respect to that of the starting material.

Figure 4:
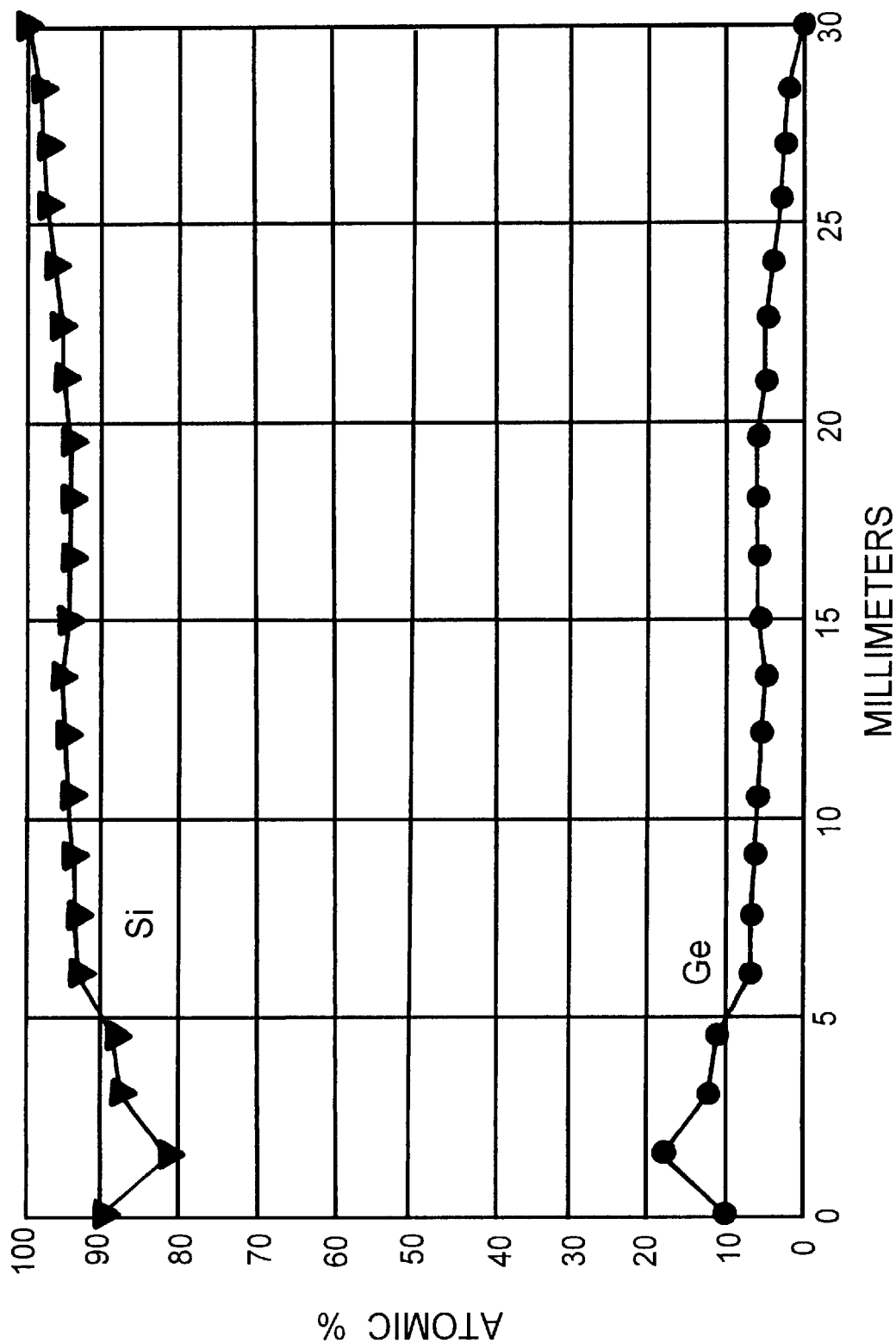
FIG. 4 illustrates the compositional analysis by WSS of a 30 mm. long alloy crystal from the tail end (at the left) to the silicon seed (at right end).

To gauge the compositional uniformity numerically, EDS was performed on three cross sections of a single crystal SiGe alloy at five radial points, spanning a distance of −6 mm, starting from the seed interface. Results are listed in Table 1, along with an average (of 4 points) WSS value, taken from the middle section (4 mm from seed interface). In the Table, points 1 through 4 were sampled around the periphery and point 5, at the center. The generally lower Ge concentration near the seed interface is thought to be due either to incomplete mixing within the melt or to partial meltback of the Si seed. The 2% difference between EDS values and the WSS data is not unexpected at these relatively low Ge levels, but the WSS quantification is generally more reliable. This sample illustrates both compositional uniformity and single crystal orientation. It should be emphasized that the attainment of either parameter alone does not necessarily imply the other. For example, a 30 mm long crystal containing multiple orientations was grown with a homogeneous distribution as illustrated in FIG. 4, showing the WSS measurement from tail to seed.

TABLE 1

Germanium Concentrations (at. %) of Single Crystal SiGe Alloy

| Position (radial) (vertical) | 1 | 2 | 3 | 4 | 5 |
|---|---|---|---|---|---|
| seed end | 2.6 | 1.5 | 2.0 | 2.1 | 1.3 |
| middle | 2.4 | 3.3 | 2.3 | 2.2 | 2.2 |
| tail end | 2.6 | 2.1 | 3.0 | 2.6 | 2.1 |
| WSS avg.+ | | | 4.53, | | |

*-above seed interface
+-@ 15 kV, 66 nA, 20 s count time

The LEZM method has been demonstrated for bulk growth of SiGe mixed crystals. Accurate control the growth process is dependent on knowledge of three critical parameters, the temperature, melt composition, and zone size. All three were determined by measuring the temperature profile using a fiber optic thermometer for a given set of conditions. Single crystals were grown at a mean composition of 2.29 at. % Ge, for 2.5 centimeters with standard deviation of 0.26. WSS measurement yielded 4.5 at. % Ge for the same sample. These crystals have been characterized by x-ray and electron beam analysis techniques to determine the uniformity and crystal structure. The electron microscope was used to show compositional uniformity by EDS and electron backscattering, while crystal structure was revealed by electron channeling patterns and x-ray diffraction.

Clearly many modifications and variations of the present invention are possible in light of the above teachings and it is therefore understood, that within the inventive scope of the inventive concept, that the invention may be practiced otherwise than specifically claimed.

What is claimed is:

1. A process for the growth of bulk single crystals of silicon-germanium alloy, said process comprising:

providing a crystal growth furnace for liquid encapsulated zone melting;

providing a single crystal silicon seed;

providing a pre-cast cylinder of silicon-germanium polycrystalline material;

placing the silicon seed into an ampoule;

placing a disk of germanium on the seed;

placing said pre-cast cylinder on the disk;

placing an encapsulant onto said pre-cast cylinder;

placing the loaded ampoule into the crystal growth furnace wherein the seed is within the melt zone;

establishing a melt zone having a predetermined temperature gradient;

moving said ampoule through the melt zone to form the bulk alloy silicon-germanium single crystal.

2. A process as defined in claim 1 wherein said encapsulant is Calcium Chloride whereupon melting said encapsulant covered the inside surface of said ampoule.

3. A process as defined in claim 2 wherein said ampoule is made of quartz and the encapsulant therein prevents sticking of the melt to the ampoule and nucleation.

4. A process as defined in claim 1 wherein said temperature gradient is measured by means of a fiber optic thermometer.

5. A process as defined in claim 1 wherein a thermal gradient between the seed and the melt is measured to be about 170° centigrade per centimeter and the melting gradient above the melt zone is about 210° centigrade per centimeter.

* * * * *